United States Patent
Huang et al.

(10) Patent No.: US 10,102,657 B2
(45) Date of Patent: Oct. 16, 2018

(54) GENERATING ENHANCED IMAGES USING DIMENSIONAL DATA

(71) Applicant: Houzz, Inc., Palo Alto, CA (US)

(72) Inventors: Xiaoyi Huang, San Mateo, CA (US); Aaron Yip, Menlo Park, CA (US)

(73) Assignee: Houzz, Inc., Palo Alto, CA (US)

( * ) Notice: Subject to any disclaimer, the term of this patent is extended or adjusted under 35 U.S.C. 154(b) by 0 days.

(21) Appl. No.: 15/454,400

(22) Filed: Mar. 9, 2017

(65) Prior Publication Data
US 2018/0260988 A1    Sep. 13, 2018

(51) Int. Cl.
| | |
|---|---|
| *G06F 17/50* | (2006.01) |
| *G06T 11/60* | (2006.01) |
| *G06T 17/20* | (2006.01) |
| *G06T 19/20* | (2011.01) |
| *G06T 15/20* | (2011.01) |
| *G06F 3/14* | (2006.01) |

(52) U.S. Cl.
CPC ........... *G06T 11/60* (2013.01); *G06F 3/14* (2013.01); *G06F 17/5009* (2013.01); *G06T 15/205* (2013.01); *G06T 17/20* (2013.01); *G06T 19/20* (2013.01)

(58) Field of Classification Search
None
See application file for complete search history.

(56) References Cited

U.S. PATENT DOCUMENTS

| | | | | |
|---|---|---|---|---|
| 7,062,722 | B1* | 6/2006 | Carlin | G06Q 30/02 |
| | | | | 715/781 |
| 2009/0237396 | A1* | 9/2009 | Venezia | G06T 19/00 |
| | | | | 345/419 |
| 2010/0066733 | A1* | 3/2010 | Kulkarni | H04L 41/22 |
| | | | | 345/419 |

OTHER PUBLICATIONS

"International Application Serial No. PCT/US2018/021723, International Search Report dated Apr. 6, 2018", 2 pgs.
"International Application Serial No. PCT/US2018/021723, Written Opinion dated Apr. 6, 2018", 5 pgs.

* cited by examiner

*Primary Examiner* — Said Broome
(74) *Attorney, Agent, or Firm* — Schwegman Lundberg & Woessner, P.A.

(57) ABSTRACT

A flat scene modeler can more accurately simulate items in environments by receiving instructions to model a given 2D depiction of an item in a given 2D depiction of a room. The flat scene modeler can analyze the instructions and arrange a 3D model of the item in a 3D model of the room. Textures, materials, lighting, and virtual camera position are modified per the received instructions. Two-dimensional images rendered from the 3D models can be provided to a user as a simulation.

14 Claims, 10 Drawing Sheets

GENERATING ENHANCED IMAGES USING DIMENSIONAL DATA

TECHNICAL FIELD

Embodiments of the present disclosure relate generally to generating visualizations and, more particularly, but not by way of limitation, to generating enhanced images using additional dimensions.

BACKGROUND

Often, users who browse items (e.g., furniture) online are forced to make decisions about the items without being able to physically inspect the items. That is, the users are forced to ascertain qualities about an item without inspecting the item in context (e.g., in relation to the item's surroundings). Some conventional approaches allow overlaying an image of an item over an image of a room to simulate how the item may look in the room. However, the image of the item is often not visually congruent with the image of the room due to differences in orientation, lighting, sizing, and other issues. For example, real-time rendering applications are unable to simulate the full interaction of light (e.g., global illumination) with the item, thereby causing the resulting render of the item to appear unrealistic. Further, photorealistic rendering applications are often computationally intensive and slow making the applications ill-suited for low-power computing devices (e.g., mobile phones). It is to these technical challenges that the below approaches are directed.

BRIEF DESCRIPTION OF THE DRAWINGS

Various ones of the appended drawings merely illustrate example embodiments of the present disclosure and should not be considered as limiting its scope.

DETAILED DESCRIPTION

The description that follows includes systems, methods, techniques, instruction sequences, and computing machine program products that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

In various example embodiments, a flat scene modeler is implemented to generate a realistic simulation (e.g., image, flat scene) of an item in a room using three-dimensional models of the item and the room. Two-dimensional (2D) depictions of the rooms to be modeled may be uploaded or otherwise stored by users such as artists, contractors, designers, and architects. An example of a 2D depiction of a room include images, such as a photo of the room or a floor plan of the room. The flat scene modeler can use the floor plans or rendered images of the rooms to create three-dimensional (3D) models of the rooms in a 3D modeling application. The flat scene modeler can manage a library of items for simulations in the rooms. The items can be furniture items such as chairs, tables, or lamps, though one of ordinary skill in the art will appreciate that other items can be modeled in a similar manner. Each of the items in the library may include photos of the item from different perspectives and 3D model data of the item. A user can choose from different room options and different item options for a simulation. In some example embodiments, 2D images of the rooms and photos are displayed to the user for the selection and object placement processes, while the 2D background image of the room, and 3D models of the rooms and items are used for the simulation processes.

For example, a user may peruse a photo catalog of tables and select a particular table. Further, the user may peruse a room catalog and select a particular room. The user may then drag and drop a photo of the selected table over an area of a photo of the selected room. In response to the drag and drop, the flat scene modeler may analyze the area in which the photo of the table was dropped to determine the room orientation and other placement details, as described in further detail below. The flat scene modeler may then arrange a 3D model of the table in a 2D background image of the room according to the placement details. In some example embodiments, the 3D model of the room is a collision mesh aligned to the 2D background image of the room. The collision mesh can be used to detect whether placement of the object collides with the ground or walls of the room. In this way, the lightweight collisions mesh can efficiently be used determine proper alignment of the object as placed over the 2D background image of the room. The 3D model of the table may be rotated, translated, resized, or transformed in other ways so that the table will appear congruent in the room. The flat scene modeler may place a virtual camera at a position within the 2D image of the room according to user instructions. For example, before the user drags and drops the table on the room, the user may adjust the view of the room by panning right or left or zooming in or out. The virtual camera position is then set so that the view of the room as adjusted by the user will match a view from the virtual camera. The flat scene modeler may then generate a rendering of the table arranged in the room. The rendering may be displayed as a simulation of how the table would look if physically placed in the room. In this way, a user can more accurately simulate how objects look in environments over a network (e.g., the Internet), without having physical access to the objects.

Figure 1:
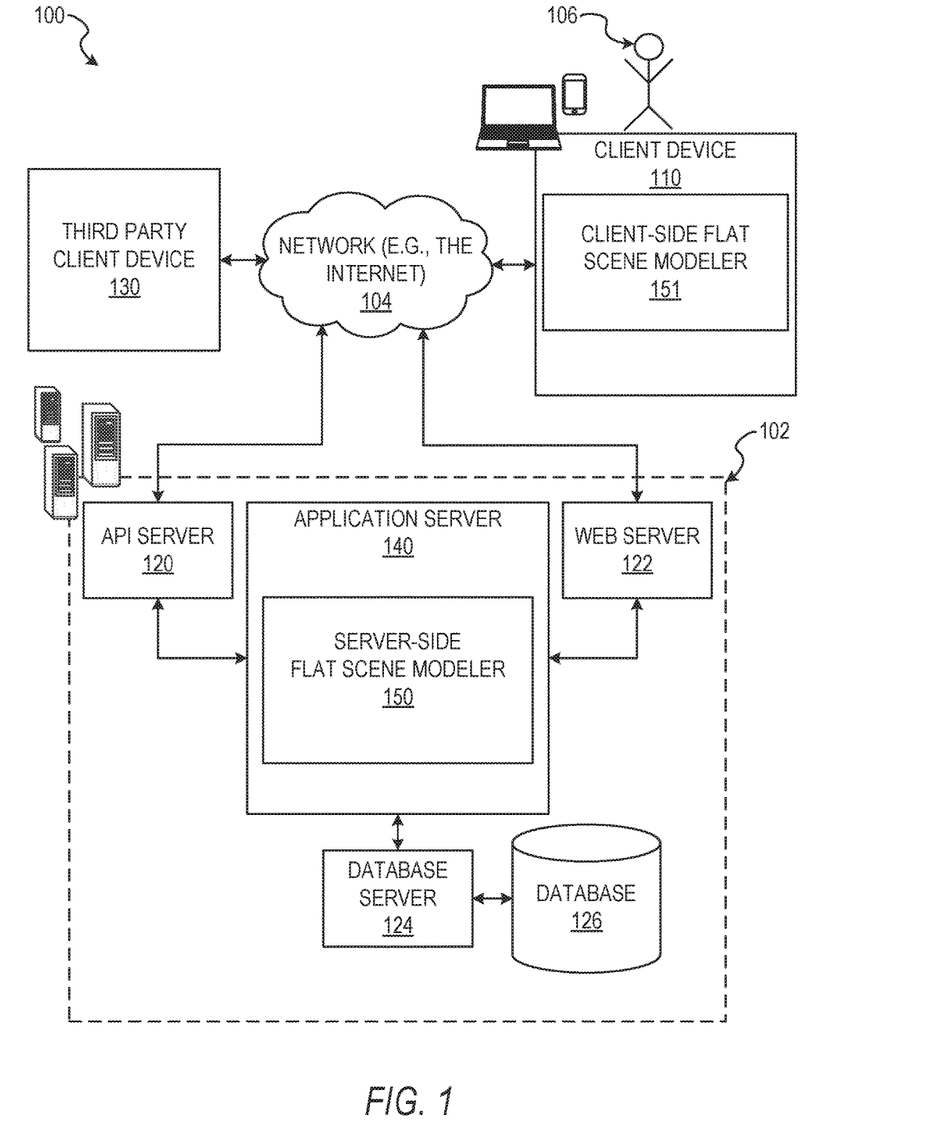
FIG. 1 is a block diagram illustrating a networked system, according to some example embodiments.

With reference to FIG. 1, an example embodiment of a high-level client-server-based network architecture 100 is shown. A networked system 102 provides server-side functionality via a network 104 (e.g., the Internet or a wide area network (WAN)) to one or more client devices 110. In some implementations, a user 106 interacts with the networked system 102 using the client device 110. FIG. 1 illustrates, for example, a client-side flat scene modeler 151 executing on the client device 110 that is configured to interface with a server-side flat scene modeler 150 to form a flat scene modeler system, according to some example embodiments. Although FIG. 1 shows one client device 110, in other implementations, the network architecture 100 comprises multiple client devices.

In various implementations, the client device 110 comprises a computing device that includes at least a display and communication capabilities that provide access to the networked system 102 via the network 104. The client device 110 comprises, but is not limited to, a remote device, work station, computer, general-purpose computer, Internet appliance, hand-held device, wireless device, portable device, wearable computer, cellular or mobile phone, Personal Digital Assistant (PDA), smart phone, tablet, ultrabook, netbook, laptop, desktop, multi-processor system, microprocessor-based or programmable consumer electronic system, game console, set-top box, network Personal Computer (PC), mini-computer, and so forth. In an example embodiment, the client device 110 comprises one or more of a touch screen, accelerometer, gyroscope, biometric sensor, camera, microphone, Global Positioning System (GPS) device, and the like.

The client device 110 communicates with the network 104 via a wired or wireless connection. For example, one or more portions of the network 104 comprise an ad hoc network, an intranet, an extranet, a virtual private network (VPN), a local area network (LAN), a wireless LAN (WLAN), a WAN, a wireless WAN (WWAN), a metropolitan area network (MAN), a portion of the Internet, a portion of the public switched telephone network (PSTN), a cellular telephone network, a wireless network, a Wi-Fi® network, a Worldwide Interoperability for Microwave Access (Wi-Max) network, another type of network, or any suitable combination thereof.

In some example embodiments, the client-side flat scene modeler 151 is implemented within a web browser. In those embodiments, the web browser accesses the various systems of the networked system 102 via the web interface supported by a web server 122 or an Application Programming Interface (API) server 120.

Users (e.g., the user 106) comprise a person, a machine, or another means of interacting with the client device 110. In some example embodiments, the user is not part of the network architecture 100, but interacts with the network architecture 100 via the client device 110 or another means. For instance, the user provides input (e.g., touch screen input or alphanumeric input) to the client device 110 and the input is communicated to the networked system 102 via the network 104. In this instance, the networked system 102, in response to receiving the input from the user, communicates information to the client device 110 via the network 104 to be presented to the user. In this way, the user can interact with the networked system 102 using the client device 110.

An application server 140 can host the server-side flat scene modeler 150, which can comprise one or more modules or applications, each of which can be embodied as hardware, software, firmware, or any combination thereof. The application server 140 is, in turn, shown to be coupled to a database server 124 that facilitates access to one or more information storage repositories, such as a database 126. In an example embodiment, the database 126 comprises one or more storage devices that store information to be accessed by the flat scene modeler system. For example, 3D model data of the objects and rooms, as well as photos and floor plans of the rooms, may be stored in the database 126. Additionally, third-party users such as contractors, designers, and architects may use client devices, such as a third-party client device 130, to upload room data, such as floor plans or photos of rooms to be simulated.

Further, while the client-server-based network architecture 100 shown in FIG. 1 employs a client-server architecture, the present inventive subject matter is, of course, not limited to such an architecture, and can equally well find application in a distributed, or peer-to-peer, architecture system, for example. The various systems of the application server 140 can also be implemented as standalone software programs, which do not necessarily have networking capabilities.

Figure 2A:
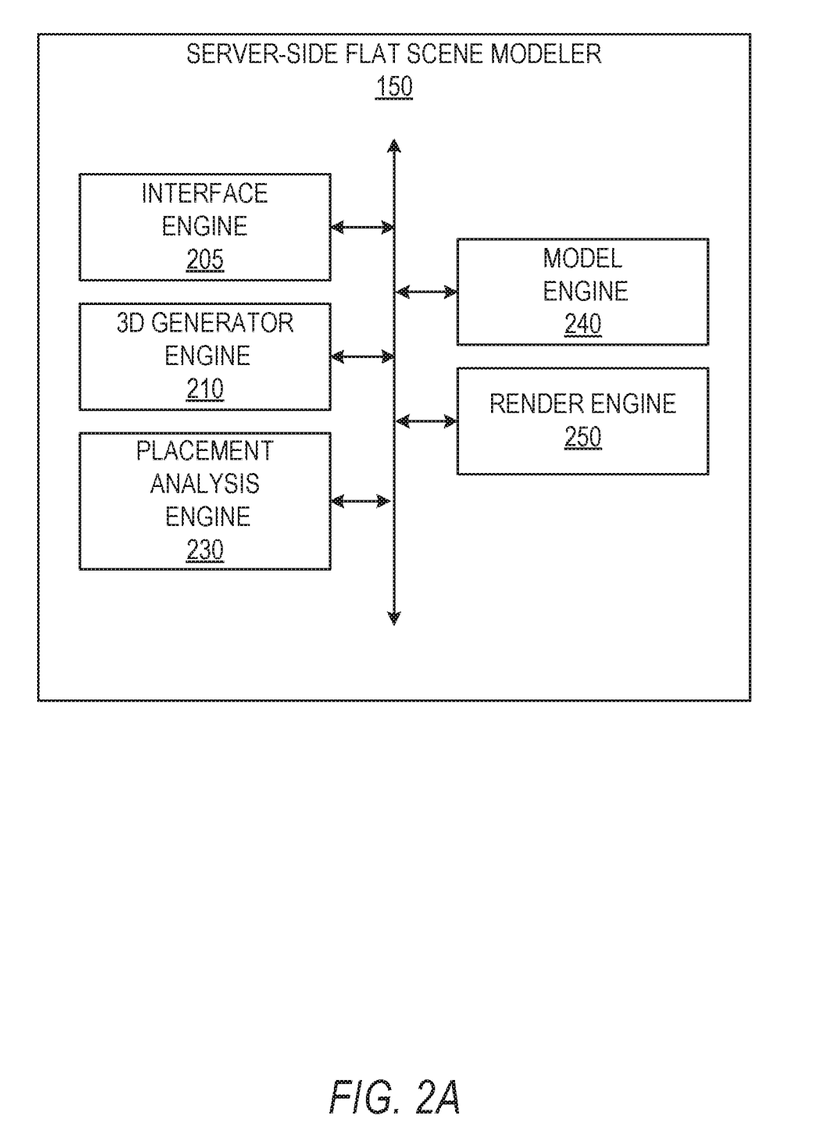
FIG. 2A shows internal functional components of a server-side flat scene modeler, according to some example embodiments.

FIG. 2A shows internal functional components of a server-side flat scene modeler 150, according to some example embodiments. The components themselves are communicatively coupled (e.g., via appropriate interfaces) to each other and to various data sources, so as to allow information to be passed between or among the applications or so as to allow the applications to share and access common data. The server-side flat scene modeler 150 is configured to perform server-side functions of the flat scene modeler system. As illustrated, the server-side flat scene modeler 150 comprises a interface engine 205, a 3D generator engine 210, a placement analysis engine 230, a model engine 240, and a render engine 250.

The interface engine 205 is configured to communicate with the client device 110 through the client-side flat scene modeler 151. The 3D generator engine 210 is configured to generate 3D models of 2D rooms or 2D environments (e.g., images of 2D room or 2D environments). The placement analysis engine 230 is configured to analyze a placement instruction received from the client device 110. The model engine 240 manages placing a 3D model of the object in the 2D image of the room according to the placement instruction and the surfaces of the environment (e.g., walls, floors, ceilings of a room). The render engine 250 manages rendering the 3D model of the object arranged in the 3D model of the room, where the rendering is performed from a virtual camera at a position within the 3D model of the room.

Figure 2B:
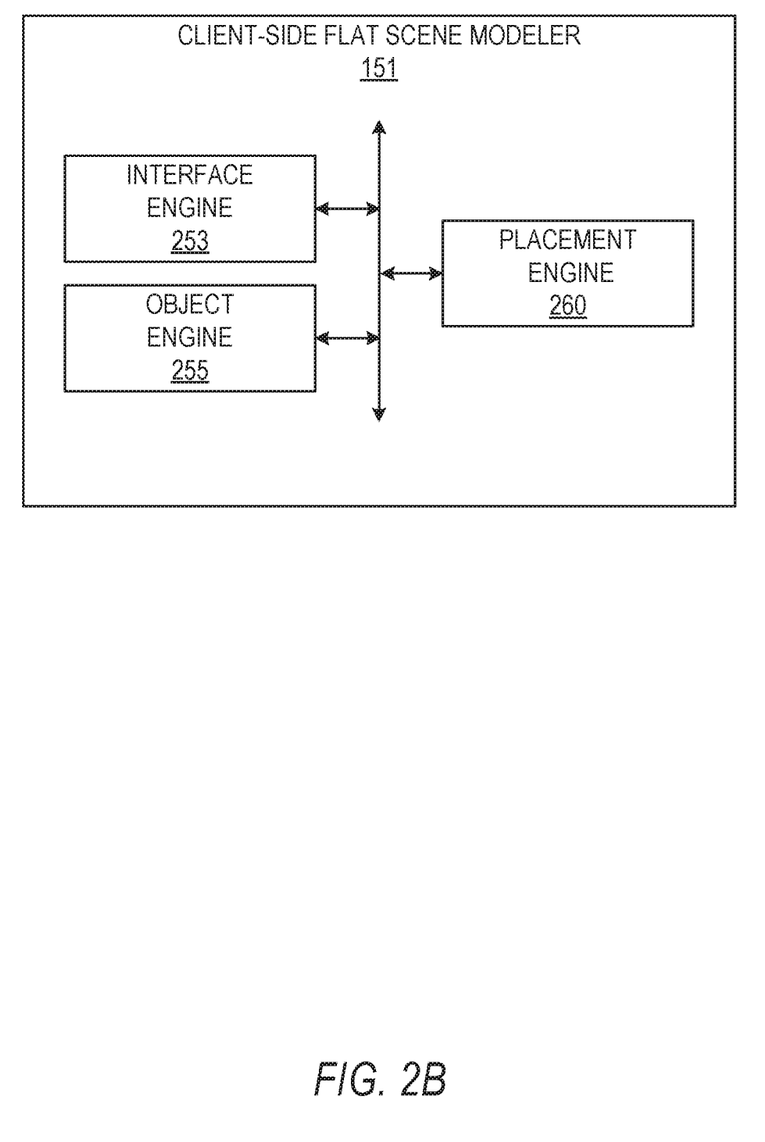
FIG. 2B shows internal functional components of a client-side flat scene modeler, according to some example embodiments.

FIG. 2B shows internal functional components of a client-side flat scene modeler 151, according to some example embodiments. The components themselves are communicatively coupled (e.g., via appropriate interfaces) to each other and to various data sources, so as to allow information to be passed between or among the applications or so as to allow the applications to share and access common data. The client-side flat scene modeler 151 is configured to perform client-side functions of the flat scene modeler system. As illustrated, the client-side flat scene modeler 151 comprises an interface engine 253, an object engine 255, and a placement engine 260. The interface engine 253 is configured to communicate with the application server 140 through the server-side flat scene modeler 150. The object engine 255 manages displays of a plurality of objects (e.g., couches, chairs, lamps) for placement inside a room. The placement engine 260 manages generating a placement instruction by enabling the user 106 to select a 2D or 3D image of an object and place it within an area of the 3D model of the room using the client device 110.

Figure 3:
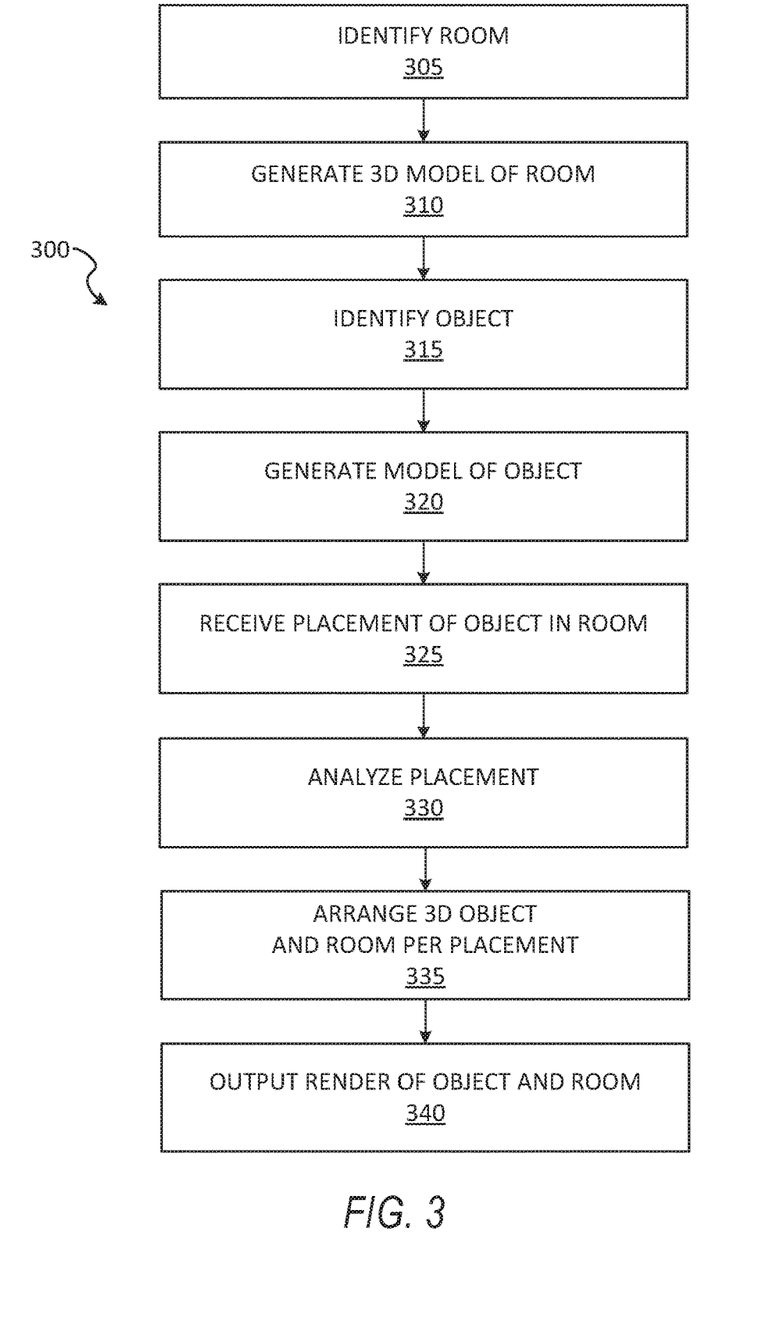
FIG. 3 shows a flow diagram of a method for generating enhanced images using additional dimensions, according to some example embodiments.

FIG. 3 shows a flow diagram of a method 300 for generating enhanced images using additional dimensions, according to some example embodiments. At operation 305, the 3D generator engine 210 identifies a 2D room. Examples of 2D rooms include photographs of rooms, floorplans, or blueprints uploaded by contractors, architects, designers, or other users. At operation 310, the 3D generator engine 210 generates a 3D model of the 2D room. At operation 315, the 3D generator engine 210 identifies a 2D object (e.g., a photo of an object, photos of the object from different perspectives). At operation 320, the 3D generator engine 210 generates a 3D model of the 2D object. In some example embodiments, the 3D model of the 2D object is pre-generated and stored in a 3D object database (e.g., database 126). In those example embodiments, the 3D model of the 2D object is retrieved from the database instead of being generated.

Continuing, at operation 325, the interface engine 205 receives a placement of the object in the 2D room (e.g., receives a placement instruction from a user). In some embodiments, the user places a 3D depiction of the object (e.g., 3D model) of the object onto a 2D depiction of the room. In some example embodiments, the user places a 2D depiction of the object onto a 2D depiction of the room. At operation 330, the placement analysis engine 230 analyzes the placement instruction to identify the specified area (e.g., the area in which the object was placed by the user). The placement analysis engine 230 further identifies any corners in the room (e.g., intersections of the floor and the walls of the room) for later alignment of the 3D model of the object in the 2D image of the room. The data used for later alignment includes collision data detailing whether the object as placed by the user would cause the object to collide with the wall or ground of the room. In some example embodiments, the placement analysis engine 230 assumes the placement with respect to the ground is correct. Consequently, the object is placed on the ground, and the placement analysis engine 230 analyzes whether or not the object as placed on the ground would collide with one or more walls of the room. In some example embodiments, operations 325 and 330 are performed within a single operation, e.g., receiving placement indicates the position of a target area, further discussed below.

At operation 335, the model engine 240 arranges the 3D model of the object in the 3D model of the room according to the placement data (e.g., collision data). Further, if the placement analysis engine 230 determines that, as placed on the ground, the object collides with one or more walls, then at operation 335, the model engine 240 may move the placement of the object so that that the object no longer collides with the walls. Further, according to some example embodiments, the model engine 240 uses corner data provided by the placement analysis engine 230 to rotate the object so that the back of the object faces the wall. At operation 340, the render engine 250 generates a photorealistic rendering (e.g., 2D image) of the 3D model of the object as arranged in the room. For example, the render engine 250 may render the arranged 3D model of the object, then overlay the 2D render of the object on the 2D image of the room, according to some example embodiments. Further, the arranged 3D model of the object may be rendered in a 3D model of the room, and the object and the room may be rendered together, according to some example embodiments.

Figure 4:
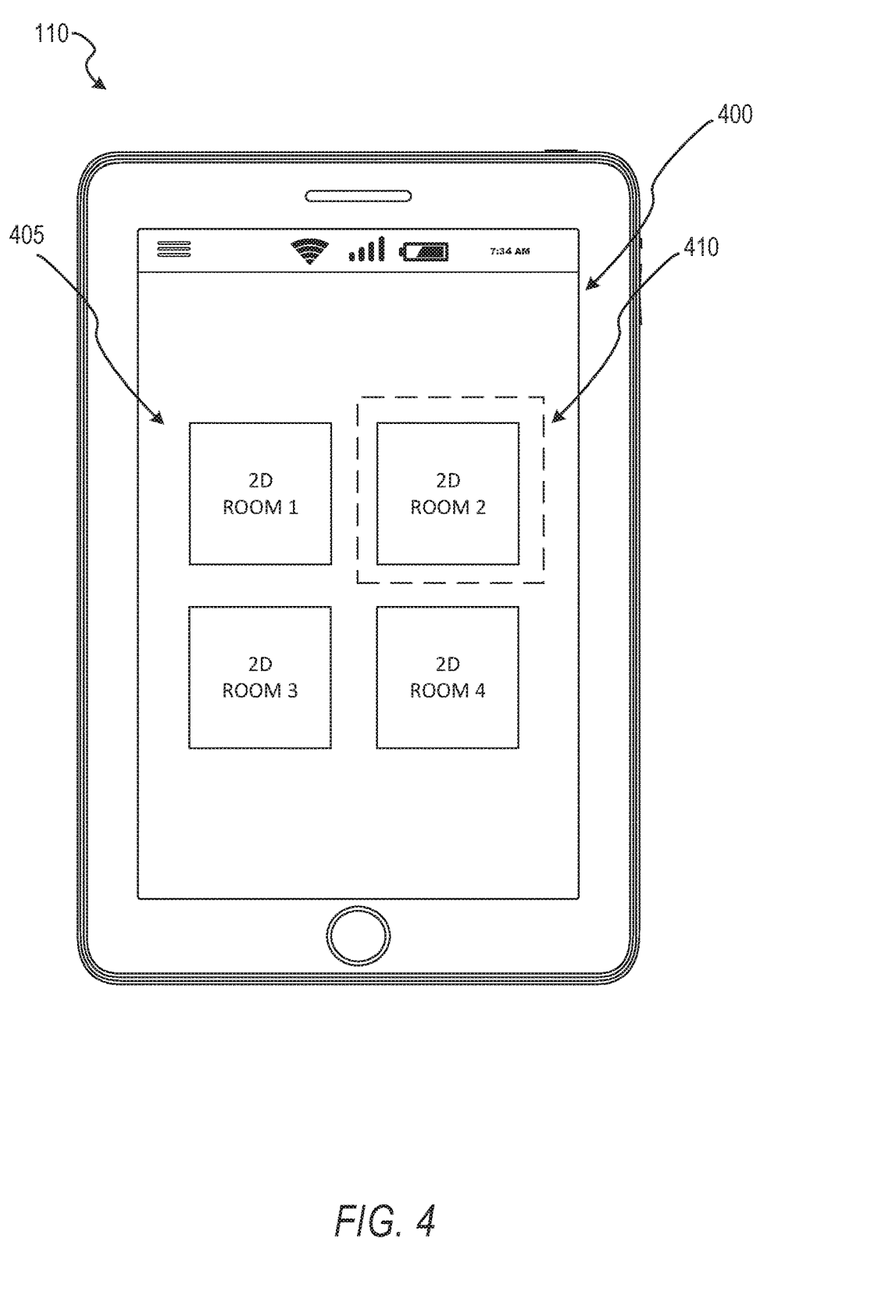
FIG. 4 shows an example client device being used for room selection, according to some example embodiments.

FIG. 4 shows the example client device 110 being used for room selection, according to some example embodiments. As illustrated, the client device 110 displays an interface 400 depicting a plurality of rooms 405 for selection by the user 106. In some example embodiments, the plurality of rooms 405 may be 2D depictions of rooms uploaded by third-party users (e.g., architects, contractors). Further, in some example embodiments, the plurality of rooms 405 may be 2D renders generated from a 3D model (e.g., a render generated by the 3D generator engine 210). As illustrated, the user 106 (not depicted) selects the second room "2D Room 2" from the interface 400 as indicated by a selection box 410.

Figure 5:
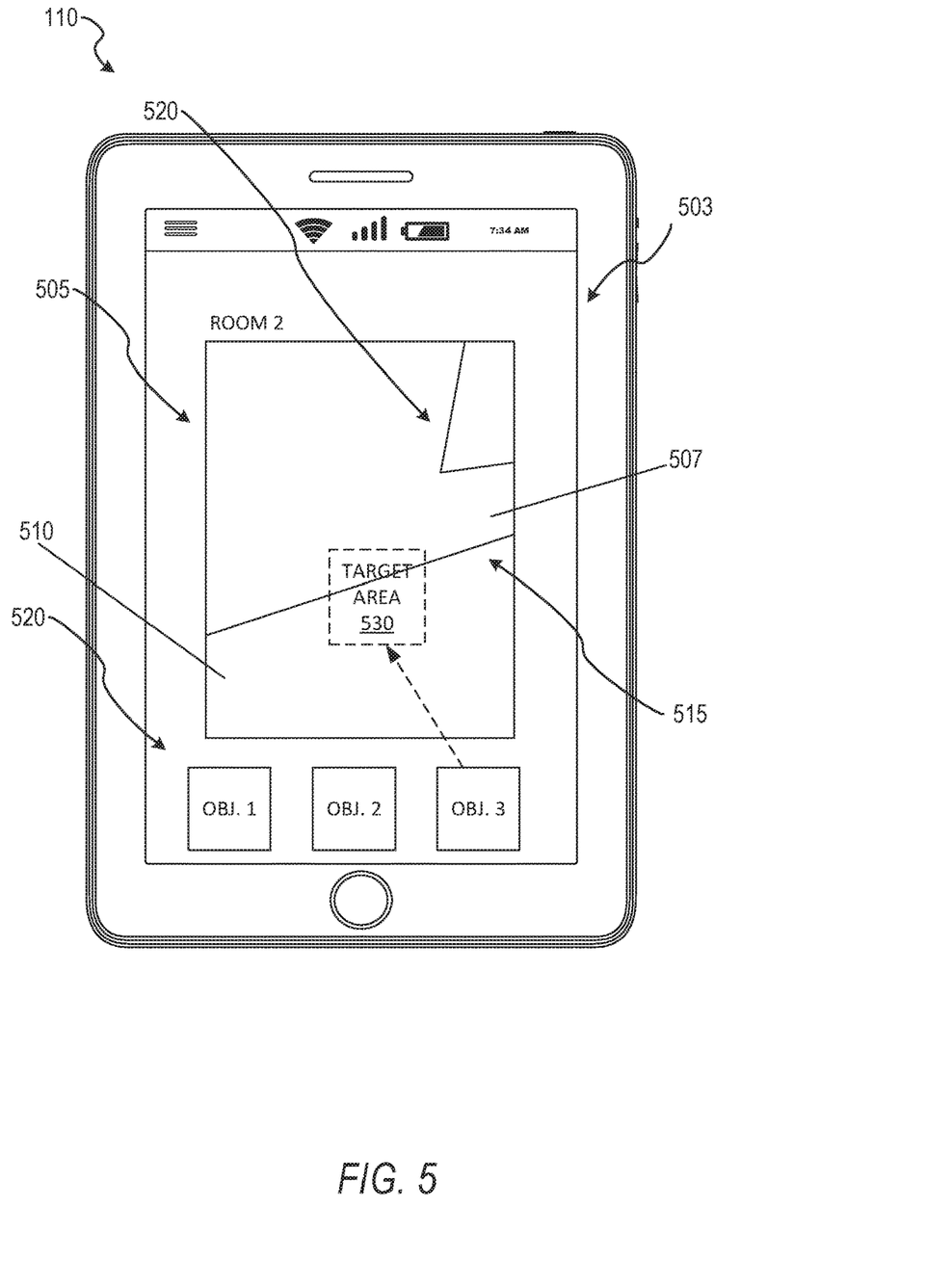
FIG. 5 shows the example client device receiving an object placement instruction, according to some example embodiments.

FIG. 5 shows the example client device 110 receiving an object placement instruction, according to some example embodiments. In response to the selection of the second room, the placement engine 260 generates a placement interface 503 displaying a portion of the second room 505. In the portion of the room displayed, a wall 507 of the room meets the floor 510 of the room at a corner 515, and a window 520 is integrated into the wall 507. The user 106 may manipulate what portion of the room is displayed by panning side to side or zooming in or out directly through the touchscreen of the client device 110, according to some example embodiments. The placement interface 503 further displays a plurality of objects 520 as options to place in the second room 505. As illustrated, the user 106 drags and drops object 3 ("Obj. 3") to a target area 530 in the second room 505.

Figure 6:
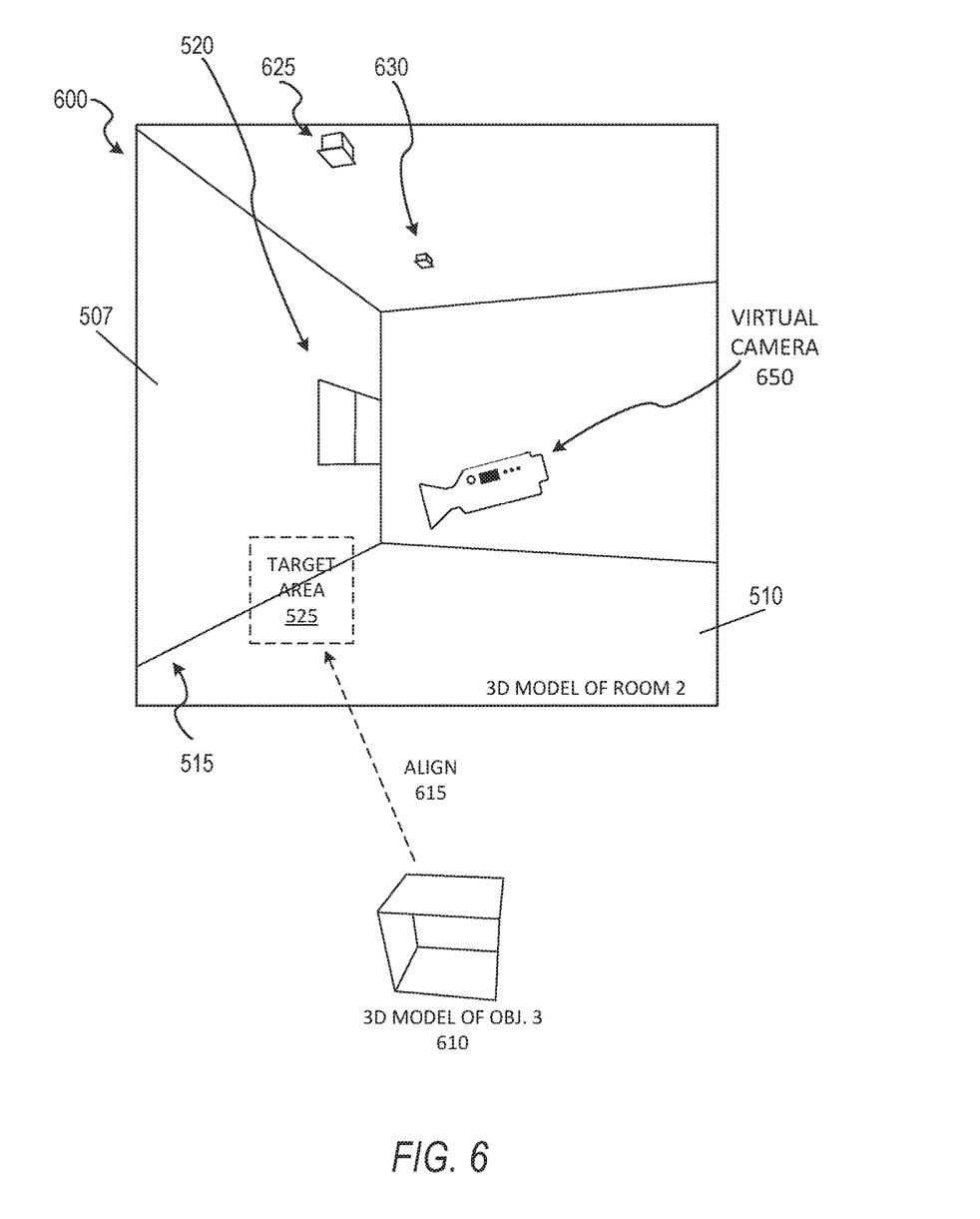
FIG. 6 shows arrangement of a 3D object in a 3D room, according to some example embodiments.

FIG. 6 shows arrangement of a 3D object in a 3D room, according to some example embodiments. In response to the user 106 dragging and dropping object 3 to the target area 530 of the room, the placement engine 260 transmits, via the interface engine 253, a placement instruction comprising an indication of the location of the target area 530 within the 2D depiction of the second room 505. The server-side interface engine 205 receives the placement instruction and conveys it to the placement analysis engine 230 for analysis. The placement analysis engine 230 receives the placement instruction and analyzes the instruction to identify correct placement parameters (e.g., position within room). The 3D generator engine 210 generates a 3D model 600 of the room. The 3D model 600 of the room is a three-dimensional model of the room that can be used for further modeling. In some example embodiments, only a collision mesh is generated as the 3D model of the room. The collision mesh may be aligned with the 2D image of the room (e.g., matching corners of the mesh to corners depicted in the 2D image of the room). In some example embodiments, the 3D model is a packaged file that contains the 2D image of the room and the corresponding collision mesh aligned to the 2D image. In this way, the 3D model can more efficiently be used to arrange the object in the room.

In some example embodiments, the 3D model 600 of the room comprises complete information about the room, including the layout of the walls (e.g., wall 507), the floor (e.g., floor 510, corner 515), wall features (e.g., window 520), lighting units (e.g., ceiling lights 625 and 630), and other objects, depending on room layout. For example, the 3D model 600 of the room may further include a 3D model of a living room furniture set if the room is a living room.

The placement analysis engine 230 further generates a 3D model of the selected object, such as a 3D model of object 3 610. The placement analysis engine 230 can then identify the wall 507, and in response, instruct the model engine 240 to rotate the 3D model of object 3 610 to align with the room. For example, if object 3 is a table or a chair with a back side and a front side, at operation 615, the model engine 240 will rotate the 3D model of object 3 610 so that the back side of object 3 is closest to the wall 507. Next, the model engine 240 may place the 3D model of object 3 610 by moving the 3D model of object 3 610 to the target area 530. Next, the render engine 250 generates a render of the 3D model of object 3 610 as placed in the 3D model 600 of the room. The render is generated from the viewpoint of a virtual camera 650 which is the perspective view of the second room 505 depicted in FIG. 5. The user 106 can change the position of the virtual camera 650 by panning side to size or zooming in or out in the placement interface 503 (FIG. 5). Further, according to some example embodiments, the user can manipulate the 3D model of the object by rotating it, enlarging it, or other manipulations. For instance, the user may use a pinch-and-enlarge gesture through a touchpad to enlarge the 3D model of object 3. Responsive to the gesture, the render engine 250 enlarges the 3D model of object 3 and overlays it in the target area 525.

The lighting of the 3D model of the object 3 can more accurately be modeled using the 3D model of the room. In particular, as the location and lighting characteristics of the light sources in the 3D model of the room are created and thus known to the render engine 250. Using the 3D model of the room, the lighting from windows, local lighting from any user defined fixtures, or an estimated ceiling light can be estimated using global illumination and light transport algorithms such as path tracing, radiosity, or photon mapping. In this way, direct lighting from the light sources themselves and also indirect lighting (e.g., light bouncing off non-light source objects in the room) can be estimated and used to more photo-realistically render the object. Further, according to some example embodiments, other lighting features such as caustics, subsurface scattering, reflections, and other aspects can be captured and estimate using the 3D model of the room.

To this end, to more accurately render the object in the room, the render engine 250 takes into account light emanating from the window 520, ceiling light 625, and ceiling light 630. The model of the object is aligned correctly because the flat scene modeler system correctly aligned it in 3 dimensions as opposed to trying to skew a 2D image of an object onto a 2D image of a room. Further, the object looks more realistic because the material and lighting were generated in 3 dimensions according to the material characteristics of the object and the lighting sources of the room, as described above.

Figure 7:
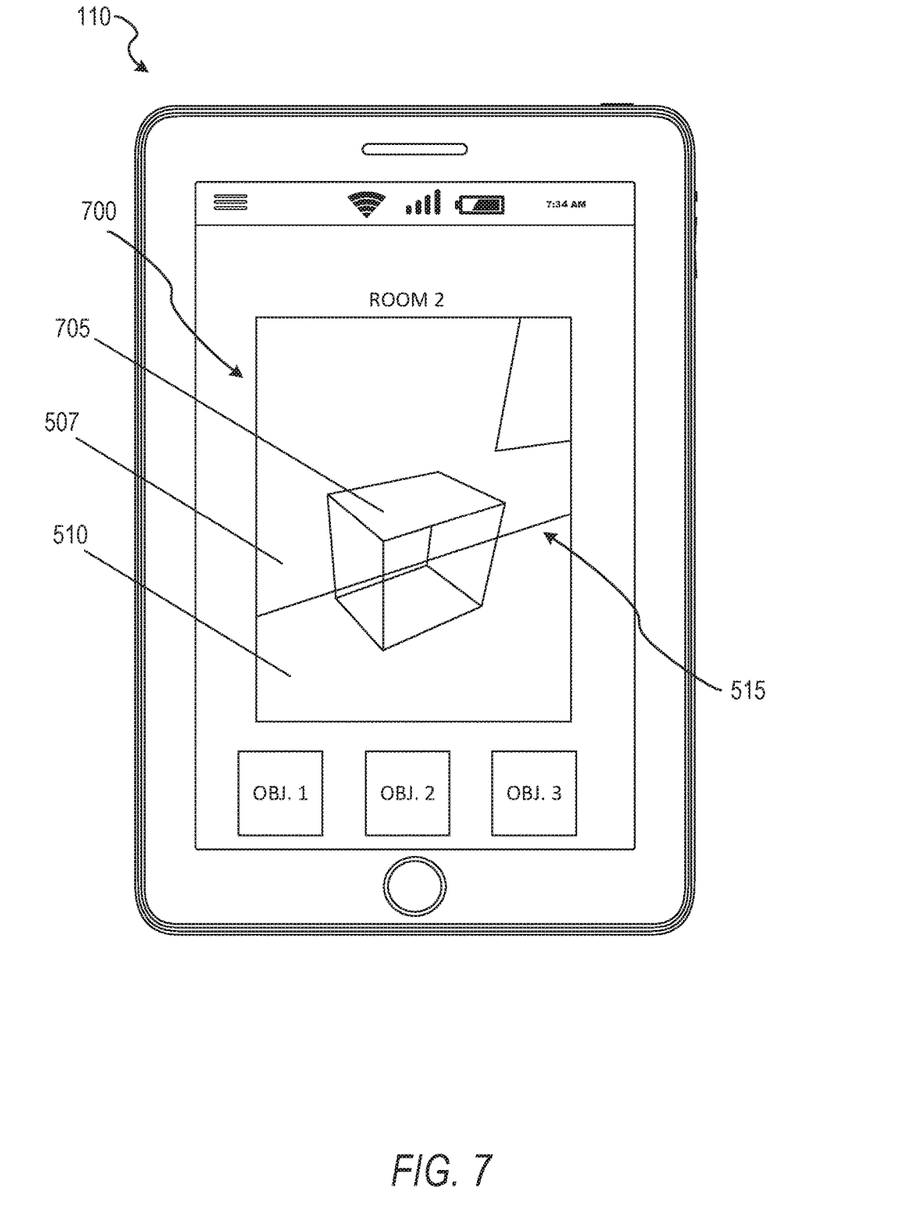
FIG. 7 shows the example client device displaying a render of the object in the room, according to some example embodiments.

FIG. 7 shows the example client device 110 displaying a render 700 of the object in the room, according to some example embodiments. After the render engine 250 generates the render of the 3D model of the object 610 arranged in the 3D model of the room, the interface engine 205 of the server-side flat scene modeler 150 transmits the render to the interface engine 253 of the client-side flat scene modeler 151. The placement engine 260 then causes the client device 110 to display the render 700 on a display (e.g., the display screen of client device 110 in FIG. 7). As illustrated, the render 700 shows a portion of the selected room from the viewpoint of the placement interface 503 (FIG. 5). Further, the render 700 shows a 2D version of the object 705 appearing to accurately sit on the floor 510 with its back side against the wall 507 parallel to the corner 515. Further, though material and shading characteristics are not depicted, one of ordinary skill in the art will appreciate that the 2D version of the object 705 displays more accurate material and shading characteristics because the render engine 250 uses the material and texture data of the object and the room lighting when the render 700 is generated.

Figure 8:
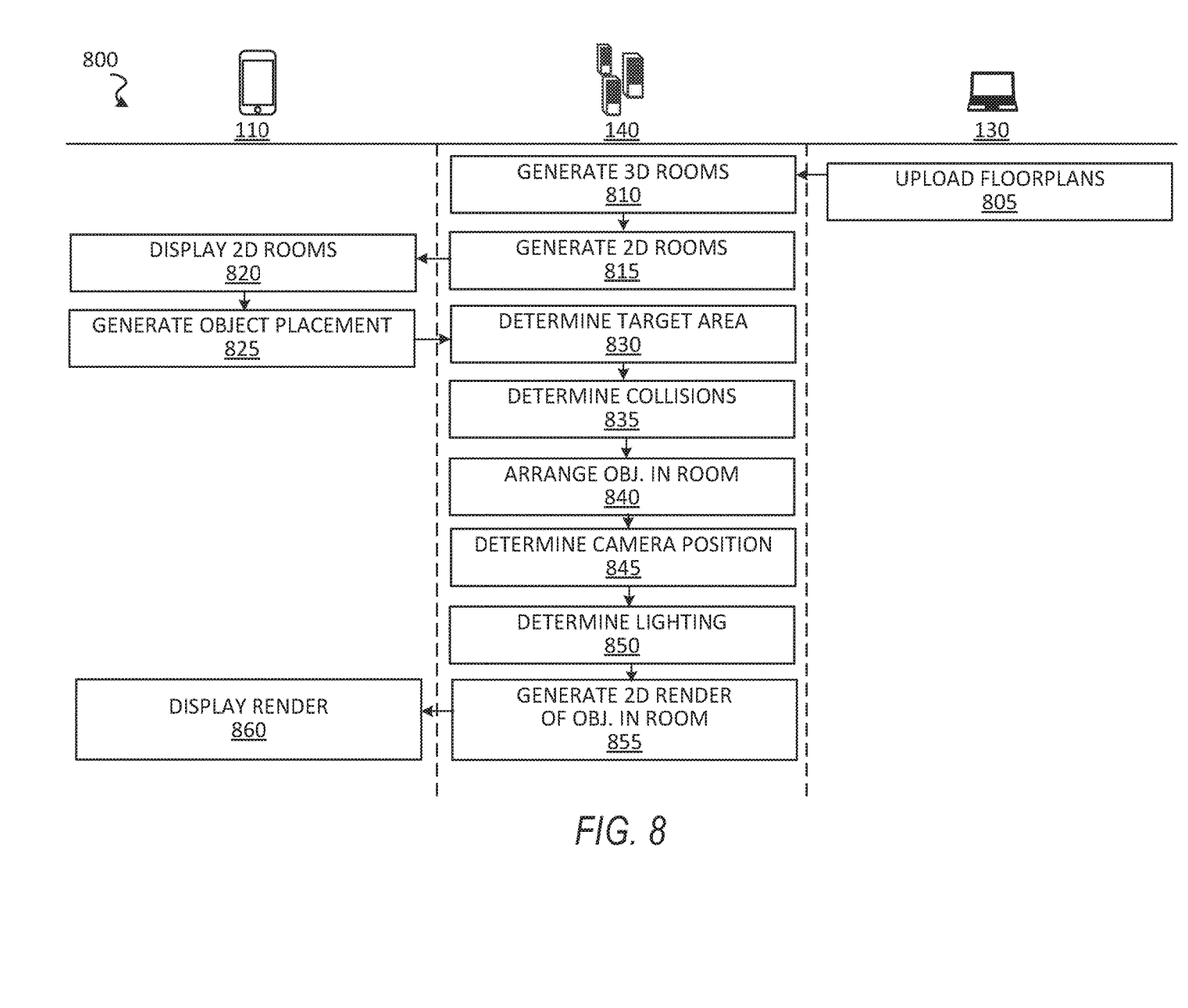
FIG. 8 shows an interaction diagram for generating enhanced images using higher dimensions using various computing entities over a network, according to some example embodiments.

FIG. 8 shows an interaction diagram 800 for generating enhanced images using higher dimensions using various computing entities over a network, according to some example embodiments. At operation 805, a third-party user (e.g., a contractor, an architect) uploads 2D depictions of one or more rooms. For example, as illustrated, the third-party user may use the third-party client device 130 to upload floorplans of rooms to the server-side flat scene modeler 150. At operation 810, the 3D generator engine 210 generates 3D models of the uploaded rooms (e.g., 3D model 600). At operation 815, the render engine 250 generates a 2D depiction of a room using the 3D model of the room. An example 2D depiction of a room is shown in FIG. 5, as the 2D view of the second room 505.

Upon the client-side flat scene modeler 151 application being initiated on the client device 110, the placement engine 260 may request available 2D rooms for display within the room selection interface of FIG. 4. Further, the object engine 255 may request available objects for placement in the rooms. At operation 820, the placement engine 260 displays the room selection interface. At operation 825, the placement engine 260 generates a placement instruction specifying an object to be placed in a target area of a selected room. For example, the user may select a room and then drag and drop an object onto an area of the room to generate the placement instruction. The placement instruction is transmitted from the interface engine 253 of the client-side flat scene modeler 151 to the interface engine 205 of the server-side flat scene modeler 150.

At operation 830, the placement analysis engine 230 maps the target area from the 2D depiction of the room to the 3D model of the room. In some example embodiments, the placement analysis engine 230 identifies any wall that is behind or nearest to the target area and assumes that the object to be placed is to be placed against the wall with the back side nearest to the wall. At operation 835, the model engine 240 determines an appropriate position for the object to be placed within the room by detecting collisions between the 3D model of the object and the walls and floors of the 3D model of the room. For example, the 3D models of the object and the room may have different collision meshes. The model engine 240 may move the model of the object within the room farther away from the viewer until the object collides with the floor of the room or the wall, according to the collision meshes. The placement analysis engine 230 then assigns the position of the object just before collision as the correct position for placement.

In some example embodiments, operations 830 and 335 are completed as part of operation 810 (generation of 3D rooms). For example, a 2D depiction of a room may be displayed to a user. The user may drag and drop an item (e.g., image of a chair) on the 2D depiction, and responsive to the drag-and-drop, the 3D room is generated (or otherwise accessed if the 3D room was already created), and further the target area is identified (operation 830) and collisions determined (operation 835).

Continuing, at operation 840, the model engine 240 arranges the 3D model of the object in the 3D model of the room according to the correct position for placement (e.g., nearest to the wall without colliding with the wall, near the floor without colliding with the floor). Additionally, at operation 840, the model engine 240 may rotate the 3D model of the object so the back side of the object is nearest to the nearest wall of the room. In some embodiments, the object is placed in the room without collision detection, and a preview render of the object placement is generated for display on the client device 110. The user 106 may then rotate, scale, or translate (move along the X, Y, Z dimensions) to correct the placement of the object. Once the user 106 has finished the corrections, the corrected target position is transmitted back to the server-side flat scene modeler 150.

At operation 845, the model engine 240 determines the position of the virtual camera for use in rendering the object in the room. For example, the user 106 may adjust the view of the room in the placement interface (e.g., adjust the view by panning to different areas of the second room 505, or zooming in or out). The model engine 240 assigns the position of the adjusted view of the room as the virtual camera position, according to some example embodiments. At operation 850, the render engine 250 determines the position and characteristics of lighting sources within the room. For example, at operation 850, the render engine 250 may identify the positions of the window 520, ceiling light 625, and ceiling light 630 within the 3D model of the room, as illustrated in FIG. 6. Further, the render engine 250 may identify characteristics of light emanating from the different sources. For example, the render engine 250 may identify the intensity, spectrum (e.g., color temperature, color, wavelength), and dispersion pattern (e.g., isotropic from a point source, cylindrical from a tube source) of the different lighting sources. At operation 855, the render engine 250 generates a 2D render of the 3D object as arranged in the room from the viewpoint of the virtual camera. The interface engine 205 of the server-side flat scene modeler 150 then transmits the render to the interface engine 253 of the client-side flat scene modeler 151. At operation 860, the client device 110 displays the photorealistic 2D render of the object in the room.

Certain embodiments are described herein as including logic or a number of components, modules, or mechanisms. Modules can constitute either software modules (e.g., code embodied on a machine-readable medium) or hardware modules. A "hardware module" is a tangible unit capable of performing certain operations and can be configured or arranged in a certain physical manner. In various example embodiments, one or more computer systems (e.g., a standalone computer system, a client computer system, or a server computer system) or one or more hardware modules of a computer system (e.g., a processor or a group of processors) can be configured by software (e.g., an application or application portion) as a hardware module that operates to perform certain operations as described herein.

In some embodiments, a hardware module can be implemented mechanically, electronically, or any suitable combination thereof. For example, a hardware module can include dedicated circuitry or logic that is permanently configured to perform certain operations. For example, a hardware module can be a special-purpose processor, such as a Field-Programmable Gate Array (FPGA) or an Application Specific Integrated Circuit (ASIC). A hardware module may also include programmable logic or circuitry that is temporarily configured by software to perform certain operations. For example, a hardware module can include software executed by a general-purpose processor or other programmable processor. Once configured by such software, hardware modules become specific machines (or specific components of a machine) uniquely tailored to perform the configured functions and are no longer general-purpose processors. It will be appreciated that the decision to implement a hardware module mechanically, in dedicated and permanently configured circuitry, or in temporarily configured circuitry (e.g., configured by software) can be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software accordingly configures a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module can perform an operation and store the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API).

The performance of certain of the operations may be distributed among the processors, not only residing within a single machine, but deployed across a number of machines. In some example embodiments, the processors or processor-implemented modules can be located in a single geographic location (e.g., within a home environment, an office environment, or a server farm). In other example embodiments, the processors or processor-implemented modules are distributed across a number of geographic locations.

The modules, methods, applications, and so forth described in conjunction with FIGS. 1-8 are implemented in some embodiments in the context of a machine and an associated software architecture. The sections below describe a representative software architecture and machine (e.g., hardware) architecture that are suitable for use with the disclosed embodiments.

Figure 9:
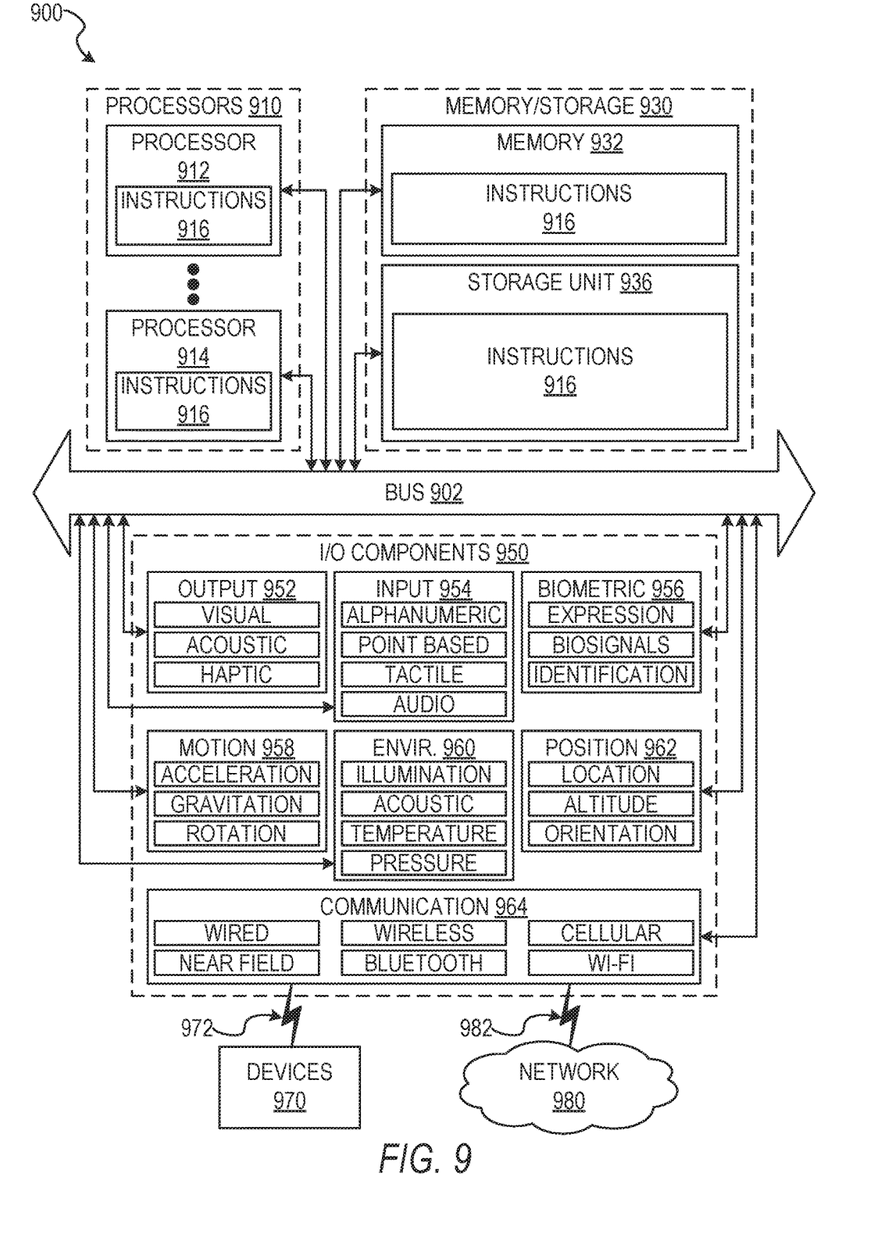
FIG. 9 is a diagrammatic representation of a machine in the form of a computer system within which a set of instructions may be executed for causing the machine to perform any one or more of the methodologies discussed herein, according to an example embodiment.

FIG. 9 is a block diagram illustrating components of a machine 900, according to some example embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a computer system, within which instructions 916 (e.g., software, a program, an application, an applet, an app, or other executable code) for causing the machine 900 to perform any one or more of the methodologies discussed herein can be executed. For example, the instructions 916 can cause the machine 900 to execute the flow diagrams of FIGS. 3 and 8. Additionally, or alternatively, the instruction 916 can implement the interface engine 205, the 3D generator engine 210, the placement analysis engine 230, the model engine 240, the render engine 250, the interface engine 253, the object engine 255, and the placement engine 260 of FIGS. 2A and 2B, and so forth. The instructions 916 transform the general, non-programmed machine into a particular machine programmed to carry out the described and illustrated functions in the manner described. In alternative embodiments, the machine 900 operates as a standalone device or can be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 can comprise, but not be limited to, a server computer, a client computer, a PC, a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

The machine 900 can include processors 910, memory/storage 930, and I/O components 950, which can be configured to communicate with each other such as via a bus 902. In an example embodiment, the processors 910 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a Radio-Frequency Integrated Circuit (RFIC), another processor, or any suitable combination thereof) can include, for example, a processor 912 and a processor 914 that may execute the instructions 916. The term "processor" is intended to include multi-core processors that may comprise two or more independent processors (sometimes referred to as "cores") that can execute instructions contemporaneously. Although FIG. 9 shows multiple processors 910, the machine 900 may include a single processor with a single core, a single processor with multiple cores (e.g., a multi-core processor), multiple processors with a single core, multiple processors with multiples cores, or any combination thereof.

The memory/storage 930 can include a memory 932, such as a main memory, or other memory storage, and a storage unit 936, both accessible to the processors 910 such as via the bus 902. The storage unit 936 and memory 932 store the instructions 916 embodying any one or more of the methodologies or functions described herein. The instructions 916 can also reside, completely or partially, within the memory 932, within the storage unit 936, within at least one of the processors 910 (e.g., within the processor's cache memory), or any suitable combination thereof, during execution thereof by the machine 900. Accordingly, the memory 932, the storage unit 936, and the memory of the processors 910 are examples of machine-readable media.

As used herein, the term "machine-readable medium" means a device able to store instructions and data temporarily or permanently and may include, but not be limited to, random-access memory (RAM), read-only memory (ROM), buffer memory, flash memory, optical media, magnetic media, cache memory, other types of storage (e.g., Erasable Programmable Read-Only Memory (EEPROM)), or any suitable combination thereof. The term "machine-readable medium" should be taken to include a single medium or multiple media (e.g., a centralized or distributed database, or associated caches and servers) able to store the instructions 916. The term "machine-readable medium" shall also be taken to include any medium, or combination of multiple media, that is capable of storing instructions (e.g., instructions 916) for execution by a machine (e.g., machine 900), such that the instructions, when executed by one or more processors of the machine 900 (e.g., processors 910), cause the machine 900 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

The I/O components 950 can include a wide variety of components to receive input, provide output, produce output, transmit information, exchange information, capture measurements, and so on. The specific I/O components 950 that are included in a particular machine will depend on the type of machine. For example, portable machines such as mobile phones will likely include a touch input device or other such input mechanisms, while a headless server machine will likely not include such a touch input device. It will be appreciated that the I/O components 950 can include many other components that are not shown in FIG. 9. The I/O components 950 are grouped according to functionality merely for simplifying the following discussion, and the grouping is in no way limiting. In various example embodiments, the I/O components 950 can include output components 952 and input components 954. The output components 952 can include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 954 can include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or other pointing instruments), tactile input components (e.g., a physical button, a touch screen that provides location and force of touches or touch gestures, or other tactile input components), audio input components (e.g., a microphone), and the like.

In further example embodiments, the I/O components 950 can include biometric components 956, motion components 958, environmental components 960, or position components 962 among a wide array of other components. For example, the biometric components 956 can include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 958 can include acceleration sensor components (e.g., an accelerometer), gravitation sensor components, rotation sensor components (e.g., a gyroscope), and so forth. The environmental components 960 can include, for example, illumination sensor components (e.g., a photometer), temperature sensor components (e.g., one or more thermometers that detect ambient temperature), humidity sensor components, pressure sensor components (e.g., a barometer), acoustic sensor components (e.g., one or more microphones that detect background noise), proximity sensor components (e.g., infrared sensors that detect nearby objects), gas sensor components (e.g., machine olfaction detection sensors, gas detection sensors to detect concentrations of hazardous gases for safety or to measure pollutants in the atmosphere), or other components that may provide indications, measurements, or signals corresponding to a surrounding physical environment. The position components 962 can include location sensor components (e.g., a GPS receiver component), altitude sensor components (e.g., altimeters or barometers that detect air pressure from which altitude may be derived), orientation sensor components (e.g., magnetometers), and the like.

Communication can be implemented using a wide variety of technologies. The I/O components 950 may include communication components 964 operable to couple the machine 900 to a network 980 or devices 970 via a coupling 982 and a coupling 972, respectively. For example, the communication components 964 include a network interface component or other suitable device to interface with the network 980. In further examples, communication components 964 include wired communication components, wireless communication components, cellular communication components, Near Field Communication (NFC) components, BLUETOOTH® components (e.g., BLUETOOTH® Low Energy), Wi-Fi® components, and other communication components to provide communication via other modalities. The devices 970 may be another machine or any of a wide variety of peripheral devices (e.g., a peripheral device coupled via a Universal Serial Bus (USB)).

Moreover, the communication components 964 can detect identifiers or include components operable to detect identifiers. For example, the communication components 964 can include Radio Frequency Identification (RFID) tag reader components, NFC smart tag detection components, optical reader components (e.g., an optical sensor to detect one-dimensional bar codes such as a Universal Product Code (UPC) bar code, multi-dimensional bar codes such as a Quick Response (QR) code, Aztec Code, Data Matrix, Dataglyph, MaxiCode, PDF417, Ultra Code, Uniform Commercial Code Reduced Space Symbology (UCC RSS)-2D bar codes, and other optical codes), acoustic detection components (e.g., microphones to identify tagged audio signals), or any suitable combination thereof. In addition, a variety of information can be derived via the communication components 964, such as location via Internet Protocol (IP) geolocation, location via Wi-Fi® signal triangulation, location via detecting a BLUETOOTH® or NFC beacon signal that may indicate a particular location, and so forth.

In various example embodiments, one or more portions of the network 980 can be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling. In this example, the coupling 982 can implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High-Speed Packet Access (HSPA), Worldwide Interoperability for Microwave Access (WiMAX), Long Term Evolution (LTE) standard, others defined by various standard-setting organizations, other long range protocols, or other data transfer technology.

The instructions 916 can be transmitted or received over the network 980 using a transmission medium via a network interface device (e.g., a network interface component included in the communication components 964) and utilizing any one of a number of well-known transfer protocols (e.g., Hypertext Transfer Protocol (HTTP)). Similarly, the instructions 916 can be transmitted or received using a transmission medium via the coupling 972 (e.g., a peer-to-peer coupling) to the devices 970. The term "transmission medium" shall be taken to include any intangible medium that is capable of storing, encoding, or carrying the instructions 916 for execution by the machine 900, and includes digital or analog communications signals or other intangible media to facilitate communication of such software.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A method comprising:
   transmitting, to a client device, a two-dimensional (2D) image of a room;
   receiving, from the client device, a placement instruction to place an object in a specified area of the 2D image of the room, the placement instruction generated on the client device using a depiction of the object;
   aligning, using a processor, a three-dimensional (3D) model of the object based at least in part on the specified area and a floor of a 3D model of the room;
   determining whether placement of the object in the specified area according to the placement instruction causes a collision between the 3D model of the object and a surface of the 3D model of the room, the 3D model of the room including a collision mesh aligned to the 2D image of the room;
   generating a 2D render of the 3D model of the object as arranged in the 3D model of the room; and
   causing a presentation of the 2D render on the client device.

2. The method of claim 1, wherein the placement instruction is generated on the client device by dragging and dropping the depiction of the object on the specified area of the 2D image of the room, and wherein the depiction of the object includes at least one of: a 2D image of the object, a 3D model of the object.

3. The method of claim 1, further comprising:
   receiving an initial 2D image of the room from an additional client device; and
   generating the 3D model of the room from the initial 2D image of the room.

4. The method of claim 1, wherein the 3D model of the object is further aligned within the 3D model of the room based at least in part on a location of a wall of the 3D model of the room.

5. The method of claim 1, wherein the 2D image of the room is generated by rendering the 3D model of the room using a virtual camera at a position within the 3D model of the room.

6. The method of claim 5, wherein the 2D render of the 3D model of the object arranged in the 3D model of the room is generated using the virtual camera at the position.

7. A system comprising:
   one or more processors of a machine; and
   a memory comprising instructions that, when executed by the one or more processors, cause the machine to perform operations comprising:
   transmit, to a client device, a two-dimensional (2D) image of a room;
   receive, from the client device, a placement instruction to place an object in a specified area of the 2D image of the room, the placement instruction generated on the client device using a depiction of the object;
   align, using a processor, a three-dimensional (3D) model of the object in a 3D model of the room based at least in part on the specified area and a floor of the 3D model of the room;
   determine whether placement of the object in the specified area according to the placement instruction causes a collision between the 3D model of the object and a surface of the 3D model of the room, the 3D model of the room including a collision mesh aligned to the 2D image of the room;
   generate a 2D render of the 3D model of the object a arranged in the 3D model of the room; and
   cause a presentation of the 2D render on the client device.

8. The system of claim 7, wherein the placement instruction is generated on the client device by dragging and dropping the depiction of the object on the specified area of the 2D image of the room, and wherein the depiction of the object includes at least one of: a 2D image of the object, a 3D model of the object.

9. The system of claim 7, the operations further comprising:
   receive an initial 2D image of the room from an additional client device; and
   generate the 3D model of the room from the initial 2D image of the room.

10. The system of claim 7, wherein the 3D model of the object is further aligned within the 3D model of the room based at least in part on a location of a wall of the 3D model of the room.

11. The system of claim 7, wherein the 2D image of the room is generated by rendering the 3D model of the room using a virtual camera at a position within the 3D model of the room.

12. The system of claim 11, wherein the 2D render of the 3D model of the object arranged in the 3D model of the room is generated using the virtual camera at the position.

13. A non-transitory computer readable storage medium comprising instructions that, when executed by one or more processors of a device, cause the device to perform operations comprising:

transmitting, to a client device, a two-dimensional (2D) image of a room;

receiving, from the client device, a placement instruction to place an object in a specified area of the 2D image of the room, the placement instruction generated on the client device using a depiction of the object;

aligning, using a processor, a three-dimensional (3D) model of the object in a 3D model of the room based at least in part on the specified area and a floor of the 3D model of the room;

determining whether placement of the object in the specified area according to the placement instruction causes a collision between the 3D model of the object and a surface of the 3D model of the room, the 3D model of the room including a collision mesh aligned to the 2D image of the room;

generating a 2D render of the 3D model of the object arranged in the 3D model of the room; and causing a presentation of the 2D render on the client device.

14. The non-transitory computer readable storage medium of claim 13, wherein the 2D image of the room is generated by rendering the 3D model of the room using a virtual camera at a position within the 3D model of the room, and wherein the depiction of the object includes at least one of: a 2D image of the object, a 3D model of the object.

* * * * *